United States Patent
Chen et al.

(10) Patent No.: US 11,646,919 B2
(45) Date of Patent: May 9, 2023

(54) IQ GENERATOR FOR MIXER

(71) Applicant: MEDIATEK Singapore Pte. Ltd., Singapore (SG)

(72) Inventors: Yang-Chuan Chen, San Jose, CA (US); Yuen Hui Chee, San Jose, CA (US); Osama Shanaa, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 96 days.

(21) Appl. No.: 17/111,995

(22) Filed: Dec. 4, 2020

(65) Prior Publication Data

US 2021/0211335 A1 Jul. 8, 2021

Related U.S. Application Data

(60) Provisional application No. 62/958,341, filed on Jan. 8, 2020.

(51) Int. Cl.
*H04B 7/00* (2006.01)
*H04L 27/00* (2006.01)
(Continued)

(52) U.S. Cl.
CPC ........... *H04L 27/0008* (2013.01); *H04B 1/28* (2013.01); *H04J 3/02* (2013.01)

(58) Field of Classification Search
CPC ..... H04L 27/0008; H04L 27/38; H04L 29/06; H04B 1/28; H04B 17/21; H04J 3/02;
(Continued)

(56) References Cited

U.S. PATENT DOCUMENTS

| 7,881,402 B2* | 2/2011 | Gao ............... H04L 27/2626 |
| | | 375/295 |
| 8,350,577 B1* | 1/2013 | Ecker .................. G01R 35/005 |
| | | 324/601 |

(Continued)

FOREIGN PATENT DOCUMENTS

| CN | 107133014 A | * | 9/2017 | ............. G06F 7/582 |
| CN | 107432715 A | * | 12/2017 | ............... A47L 9/28 |

(Continued)

OTHER PUBLICATIONS

Bin et al, CN 107432715 A (English Machine Translation), Dec. 5, 2017, FIT, pp. 1-27.*

(Continued)

*Primary Examiner* — Phuongchau Ba Nguyen
(74) *Attorney, Agent, or Firm* — Wolf, Greenfield & Sacks, P.C.

(57) ABSTRACT

An IQ generator capable of consuming lower power and occupying smaller die area. The IQ generator is configured without any synthesizer and divide-by-2 circuitry. The IQ generator may be configured to convert one or more phase outputs of a test tone generator (TTG) into I and Q signals. The IQ generator may receive as inputs differential outputs of a single phase of a TTG and/or multiple phase outputs of a TTG. The IQ generator may include one or more delay paths configured to generate the I and Q signals, and a calibration circuitry configured to compare the average pulse widths of the I and Q signals and provide one or more control signals to the one or more delay paths such that the I and Q signals are orthogonal in phase.

18 Claims, 9 Drawing Sheets

(51) Int. Cl.
*H04B 1/28* (2006.01)
*H04J 3/02* (2006.01)

(58) Field of Classification Search
CPC .... H03K 5/1565; H03K 3/0315; H03B 27/00; H03D 7/16; H04W 84/18; H04W 76/02; H04W 28/04; H04W 24/00
See application file for complete search history.

(56) References Cited

U.S. PATENT DOCUMENTS

| | | | | |
|---|---|---|---|---|
| 8,660,170 | B1* | 2/2014 | Huynh | H03M 3/38 375/224 |
| 9,479,203 | B2* | 10/2016 | Peng | H04B 1/0475 |
| 10,224,908 | B1* | 3/2019 | Fender | H03K 5/19 |
| 10,523,220 | B1 | 12/2019 | Ru et al. | |
| 2003/0104792 | A1* | 6/2003 | Doi | H03F 1/3247 455/114.2 |
| 2006/0281432 | A1* | 12/2006 | Isaac | H03D 3/009 455/323 |
| 2007/0291883 | A1* | 12/2007 | Welz | H04B 1/30 375/350 |
| 2008/0187035 | A1* | 8/2008 | Nakamura | H03F 3/245 375/232 |
| 2009/0267701 | A1 | 10/2009 | Parsa et al. | |
| 2010/0039153 | A1* | 2/2010 | Qiao | H03L 7/0812 327/254 |
| 2010/0105341 | A1* | 4/2010 | Chen | H03C 5/00 455/102 |
| 2010/0120390 | A1* | 5/2010 | Panikkath | H03B 19/12 455/208 |
| 2010/0246995 | A1 | 9/2010 | Paulus et al. | |
| 2011/0064155 | A1* | 3/2011 | Ashita | H04L 27/368 375/260 |
| 2012/0161824 | A1* | 6/2012 | Tao | H03K 5/00006 327/122 |
| 2014/0191799 | A1* | 7/2014 | Ohkawara | H03F 3/19 330/149 |
| 2014/0270001 | A1 | 9/2014 | Schubert et al. | |
| 2015/0177326 | A1 | 6/2015 | Chakraborty et al. | |
| 2019/0190451 | A1 | 6/2019 | D'Alessandro | |

FOREIGN PATENT DOCUMENTS

| | | | | |
|---|---|---|---|---|
| CN | 110708084 | A * | 1/2020 | ............... H04B 1/16 |
| CN | 111404596 | B * | 1/2022 | ......... H04B 7/18515 |
| EP | 2 797 234 | A1 | 10/2014 | |
| TW | 201941536 | A | 10/2019 | |
| WO | WO 2010/057037 | A2 | 5/2010 | |

OTHER PUBLICATIONS

Wang et al, CN 107133014 A (English Machine Translation), Sep. 5, 2017, FIT, pp. 1-10.*
Extended European Search Report dated May 14, 2021 in connection with European Application No. 20217977.6.

* cited by examiner

IQ GENERATOR FOR MIXER

RELATED APPLICATIONS

This application claims priority to and the benefit of U.S. Provisional Application Ser. No. 62/958,341, filed Jan. 8, 2020 and entitled "IQ GENERATOR FOR MIXER," which is hereby incorporated herein by reference in its entirety.

TECHNICAL FIELD

This application relates generally to IQ generators.

BACKGROUND

Wireless communication devices are commonly deployed in wireless communication systems to provide communication services such as voice, multimedia, data, broadcast, and messaging services. In a wireless communication device such as a mobile phone, an IQ generator may provide orthogonal signals represented by in-phase (I) and quadrature (Q) components.

SUMMARY

IQ generators with lower power consumption and smaller die area are provided.

Some embodiment relates to a signal generator for generating signals that are orthogonal in phase. The signal generator comprises a delay path configured to generate the signals from an input signal of a carrier frequency, and a calibration circuitry configured to provide a control signal to the delay path based at least in part on the signals. An operating frequency of the signal generator is less than twice the carrier frequency.

In some embodiments, the input signal of the carrier frequency is from a test tone generator.

In some embodiments, the input signal of the carrier frequency comprises output signals of the test tone generator that are in two different phases.

In some embodiments, the input signal of the carrier frequency comprises output signals of the test tone generator that are in a single phase.

In some embodiments, the output signals of the test tone generator comprise a pair of differential signals in the single phase.

In some embodiments, the delay path comprises one or more delay cells configured to adjust their transconductances based at least in part on the control signal from the calibration circuitry.

In some embodiments, a delay cell of the one or more delay cells comprises a pair of transistors that receive the input signal of the carrier frequency, a back-to-back inverter coupled to the pair of transistors, and a delay unit connected in series with the pair of transistors and configured to adjust its transconductance based at least in part on the control signal from the calibration circuitry.

In some embodiments, the calibration circuitry comprises a comparator configured to compare average pulse widths of the signals and provide the control signal based at least in part on the comparison.

Some embodiment relates to a signal generator for generating signals that are orthogonal in phase. The signal generator comprises one or more delay paths comprising input nodes that receive an input signal of a carrier frequency and output nodes that provide the signals, and a calibration circuitry comprising input nodes that receive the signals and an output node that provides a control signal to the one or more delay paths. An operating frequency of the signal generator is less than twice the carrier frequency.

In some embodiments, the input signal of the carrier frequency is from a test tone generator.

In some embodiments, the input signal of the carrier frequency comprises a pair of differential signals in a single phase.

In some embodiments, the one or more delay paths comprise a single delay path, and the output node of the calibration circuitry provides a respective control signal to the single delay path.

In some embodiments, the single delay path comprises a plurality of delay cells controlled by the respective control signal.

In some embodiments, the input signal of the carrier frequency has a 50% duty cycle, and the single delay path comprises a circuitry that receives signals with the 50% duty cycle and provides signals with a 25% duty cycle.

In some embodiments, the input signal of the carrier frequency comprises a first output signal of the test tone generator that is in a first phase and a second output signal of the test tone generator that is in a second phase different from the first phase.

In some embodiments, the one or more delay paths comprise a first delay path for the first output signal of the test tone generator and a second delay path for the second output signal of the test tone generator.

In some embodiments, the output node of the calibration circuitry is a first output node of the calibration circuitry. The control signal is a first control signal. The first control signal is provided to the first delay path. The calibration circuitry comprises a second output node that provides a second control signal to the second delay path.

In some embodiments, the calibration circuitry comprises a direct current (DC) filter comprising the input nodes of the calibration circuitry.

Some embodiments relate to a receiver circuit. The receiver circuit comprises a low-noise amplifier configured to receive an input signal of a carrier frequency and amplify the input signal, a test tone generator configured to generate a tone signal of the carrier frequency, a signal generator configured to generate signals that are orthogonal in phase from the tone signal of the carrier frequency generated by the test tone generator, and a mixer configured to receive the amplified input signal and the signals.

In some embodiments, the receiver circuit comprises a switch coupled between output nodes of the low-noise amplifier and the test tone generator. The switch is on when the tone signal of the carrier frequency is used to suppress sideband signals with respect to the carrier frequency.

These techniques may be used alone or in any suitable combination. The foregoing summary is provided by way of illustration and is not intended to be limiting.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Described herein are IQ generators with lower power consumption and smaller die area. The inventors have recognized and appreciated that conventional IQ generators include a synthesizer operating at twice a carrier frequency and a divide-by-2 circuitry configured to convert an output of the synthesizer of the twice the carrier frequency into orthogonal signals of the carrier frequency. A synthesizer, for example, an LC-based voltage controlled oscillator (VCO), occupies significant die area, and increases cost of a chip that includes IQ generators. In addition to occupying extra chip area, the synthesizer and divide-by-2 circuitry, both of which are operating at twice the carrier frequency, consume significant power. This problem becomes more prominent when the carrier frequency increases, for example, to 6 GHz with 801.11ax or 801.11ac.

The inventors have developed IQ generators with lower power consumption and smaller die area such that a synthesizer generating a signal of twice a carrier frequency is not needed. In some embodiments, IQ generators may be configured without any synthesizer and divide-by-2 circuitry.

In some embodiments, an IQ generator may be configured to convert one or more phase outputs of a test tone generator into I and Q signals that are orthogonal in phase. In some embodiments, an IQ generator may receive as inputs differential outputs of a single phase of a test tone generator. In some embodiments, an IQ generator may receive as inputs multiple phase outputs of a test tone generator.

In some embodiments, an IQ generator may include one or more delay paths configured to generate I and Q signals. In some embodiments, an IQ generator may include a single delay path configured to receive one of the differential outputs of the test tone generator. In some embodiments, an IQ generator may include multiple delay paths configured to receive respective phase outputs of the test tone generator. In some embodiments, each delay path may receive a respective control signal such that the I and Q signals generated are orthogonal in phase. In some embodiments, a delay path may include at least two delay cells configured to adjust their transconductances based on a control signal.

In some embodiments, an IQ generator may include a calibration circuit configured to compare the average waveform bandwidths of the I and Q signals and provide one or more control signals to the one or more delay paths such that the I and Q signals are orthogonal in phase.

Figure 1:
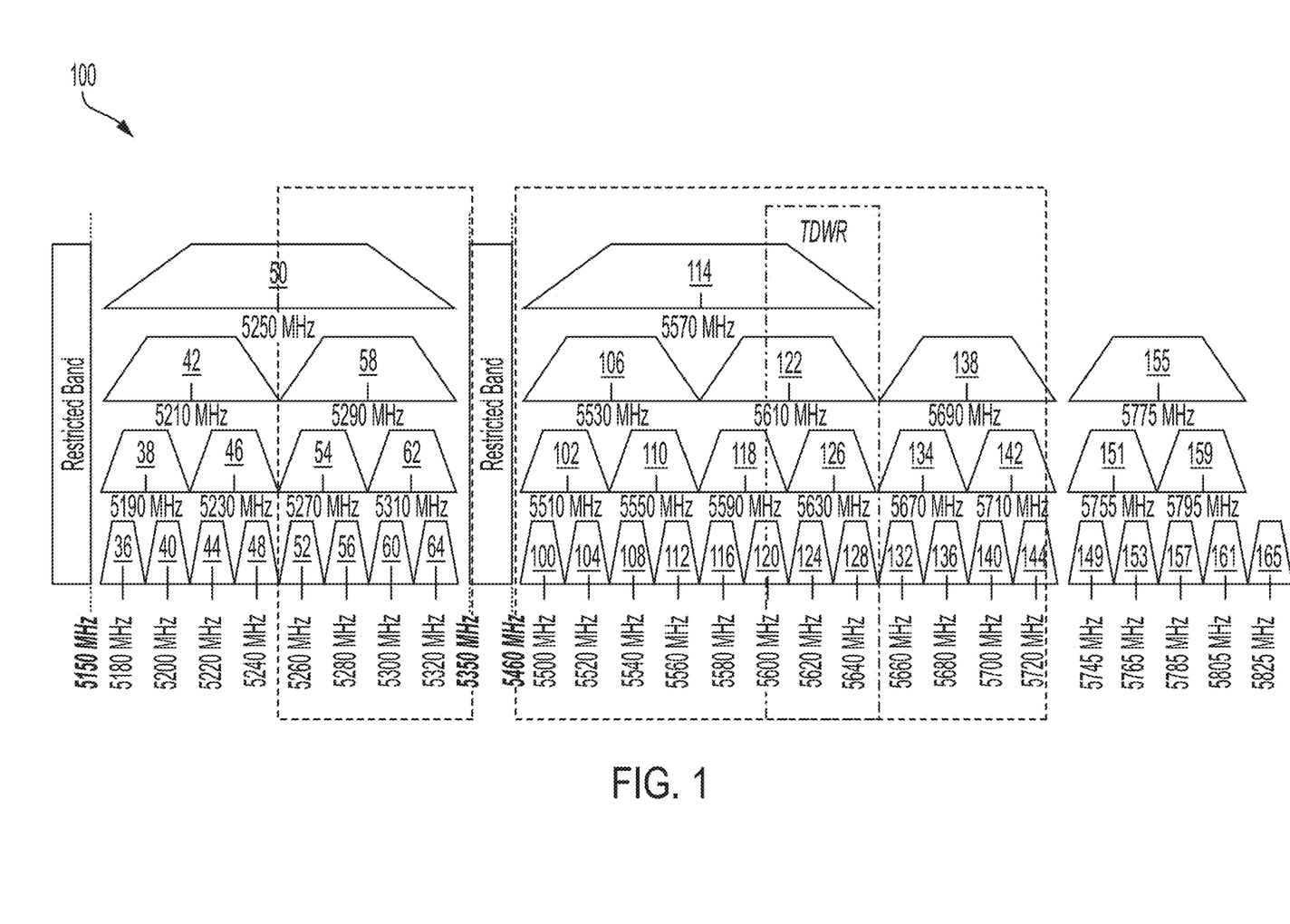
FIG. 1 is a schematic diagram of the 5 GHz WiFi band with WiFi channels and radar-WiFi dynamic frequency selection (DFS) co-channels shown.

IQ generators may be included in an application for Dynamic Frequency Selection (DFS). Pursuant to DFS, WiFi transceivers (e.g., nxn MIMO transceivers) may identify the presence of a co-channel radar signal so as to avoid such occupied channel when operating in frequency ranges that requires DFS including, for example, 5250-5350 and 5470-5725 MHz. FIG. 1 shows the 5 GHz WiFi band 100, which may include WiFi channels with bandwidths depending on the protocols used to access the channels. In the illustrated example, channels on the first row (e.g., channels 36, 100, 149 with center frequencies 5180 MHz, 5500 MHz and 5745 MHz respectively) have a bandwidth of 20 MHz; channels on the second row (e.g., channels 38, 102, 151 with center frequencies 5190 MHz, 5510 MHz and 5755 MHz respectively) have a bandwidth of 40 MHz; channels on the third row (e.g., channels 42, 106, 155 with center frequencies 5210 MHz. 5530 MHz and 5775 MHz respectively) have a bandwidth of 80 MHz; and channels on the fourth row (e.g., channels 50, 114 with center frequencies 5250 MHz and 5570 MHz respectively) have a bandwidth of 160 MHz. Some of the WiFi channels may also be available to be occupied by a radar signal and referred to as radar-WiFi DFS co-channels (e.g., channels 52-144 on the first row, channels 54-142 on the 10 second row, channels 58-138 on the third row, channels 50, 114 on the fourth row). Although a DFS application in a WiFi system improves system throughput. DFS causes a WiFi transceiver to perform a Channel Availability Check (CAC), which determines the WiFi channels that are free of radar signals. When it is identified the presence of a radar signal in the channel being utilized by the WiFi transceivers, the WiFi transceivers may jump to one of the WiFi channels that are determined through CAC as free of radar signals.

Figure 2:
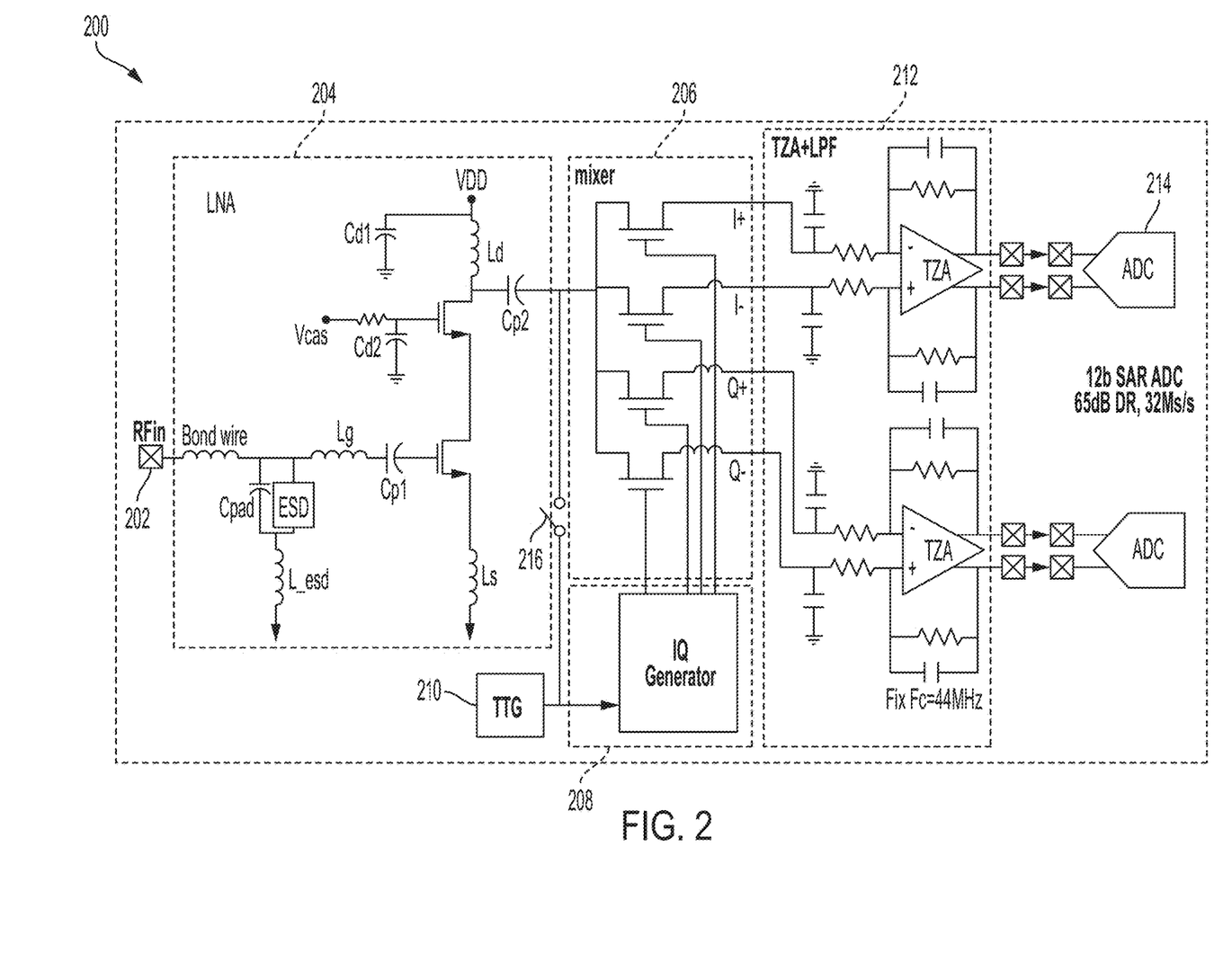
FIG. 2 is a schematic diagram of a DFS receiver, according to some embodiments.

A WiFi transceiver for DFS may include an IQ generator that provides orthogonal signals to a mixer. FIG. 2 depicts a schematic diagram of a DFS receiver 200, according to some embodiments. The DFS receiver 200 may receive an RF input signal of a carrier frequency at an input node 202. The DFS receiver 200 may include a low noise amplifier (LNA) 204 configured to amplify the RF input signal while ensuring its signal-to-noise ratio. Although the illustrated LNA is a single-ended cascade LNA with integrated input matching and inductive source denegation, any suitable LNA may be employed.

The DFS receiver 200 may include a test tone generator (TTG) 210 configured to generate a tone signal of the carrier frequency. The TTG 210 may be coupled to a mixer 206 through a switch 216. Although the illustrated switch is connected to LNA output, any connecting points of LNA input may be employed. Although the illustrated mixer is a current-mode single-balanced passive I/Q mixer, any suitable mixer may be employed. During the establishment of a WiFi link, the switch 216 may be turned on such that the tone signal generated by the TTG 210 may be used for calibration and to suppress sideband signals with respect to the carrier frequency. After the establishment of a WiFi link, the switch 216 may be turned off.

The TTG 210 may be coupled to an IQ generator 208. The TTG 210 may send one or more of its outputs of the carrier frequency to the IQ generator 208. The IQ generator 208 may be configured to convert the outputs of the TTG 210 into orthogonal signals (e.g., I+, I−, Q+, Q−) and provide the orthogonal signals to the mixer 206.

The DFS receiver 200 may include transimpedance amplifiers (TZA) and low pass filters (LPF) 212, which may be configured to drive successive-approximation-register (SAR) analog-to-digital converters (ADCs) 214. In some embodiments, the TZA+LPF 212 may be configured with a fixed bandwidth (e.g., 80 MHz) such that the scan of the entire WiFi band may complete within a desired time (e.g., 6 minutes). When a radar signal is detected in any of the fixed bandwidth channels, a digital filter may divide the band detected with the radar signal into multiple bands with smaller bandwidths (e.g., an 80 MHz band may be divided into four 20 MHz bands). Then it is determined that the radar signal is in which one of the bands with smaller bandwidths. This configuration may save scan time.

Figure 3:
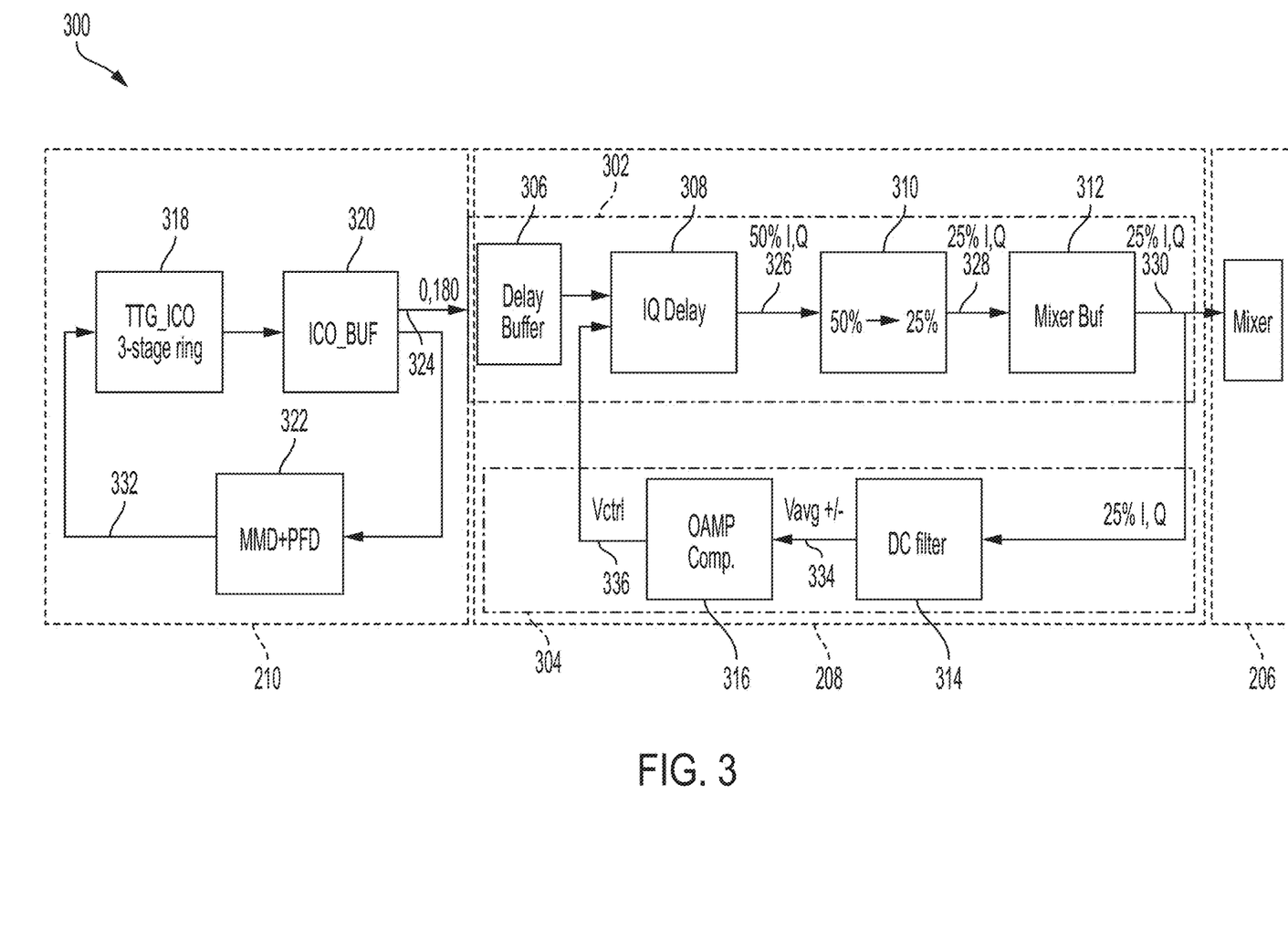
FIG. 3 is a block diagram of an IQ generator receiving an input from a test tone generator (TTG) and outputting to a mixer, according to some embodiments.

FIG. 3 is a block diagram of a portion 300 of a DFS receiver (e.g., the DFS receiver 200). The portion 300 of the DFS receiver may include an IQ generator 208 receiving an input from a TTG 210 and outputting to a mixer 206. The TTG 210 may include a ring oscillator 318, a buffer 320, and a feedback circuitry 322. The output signals 324 of the buffer 320 may be fed back to the oscillator 318 through the feedback circuitry 322. The feedback circuitry 322 may be configured to detect the phase and frequency of the output signals 324 and generate a control signal 332 for the oscillator 318 based on the detected phase and frequency of the output signals 324.

The IQ generator 208 may be configured to receive the output signals 324 of the TTG 210. The IQ generator 208 may include a delay path 302 and a calibration circuitry 304. The delay path 302 may include a delay buffer 306, an IQ delay circuitry 308, a duty-cycle adjustment circuitry 310, and a mixer buffer 312. The IQ delay circuitry 308 may receive signals from the delay buffer 306 that may receive the output signals 324 of the TTG 210. The IQ delay circuitry 308 may be configured to generate IQ signals 326 that may be substantially orthogonal in phase. The IQ signals 326 may have a duty cycle that is similar to the duty cycle of the output signals 324 of the TTG 210, for example, a 50% duty cycle as illustrated.

The duty-cycle adjustment circuitry 310 may be configured to modify the duty cycle of the IQ signals 326 to generate IQ signals 328. The IQ signals 328 may be amplified to IQ signals 330 by the mixer buffer 312, which may be provided to the mixer 206. The IQ signals 328 and 330 may have a duty cycle suitable for the mixer 206, and/or suitable for the calibration circuitry 304. In the illustrated example, the IQ signals 328 and 330 have a 25% duty cycle, which is reduced from the 50% duty cycle of the IQ signals 326. Providing, to the mixer 206 and the calibration circuitry 304, IQ signals with a 25% duty cycle may reduce signal overlapping for mixer operation.

The calibration circuitry 304 may include a DC filter 314 and a low power comparator operational amplifier 316. The DC filter 314 may be configured to provide the average pulse widths (Vavg+/−) of the IQ signals 330 to the comparator 316. The comparator 316 may be configured to generate a control signal 336, which is provided to the IQ delay circuitry 308 such that the IQ delay circuitry 308 may adjust its transconductance to make IQ signals 330 within a targeted phase error.

Figure 4A:
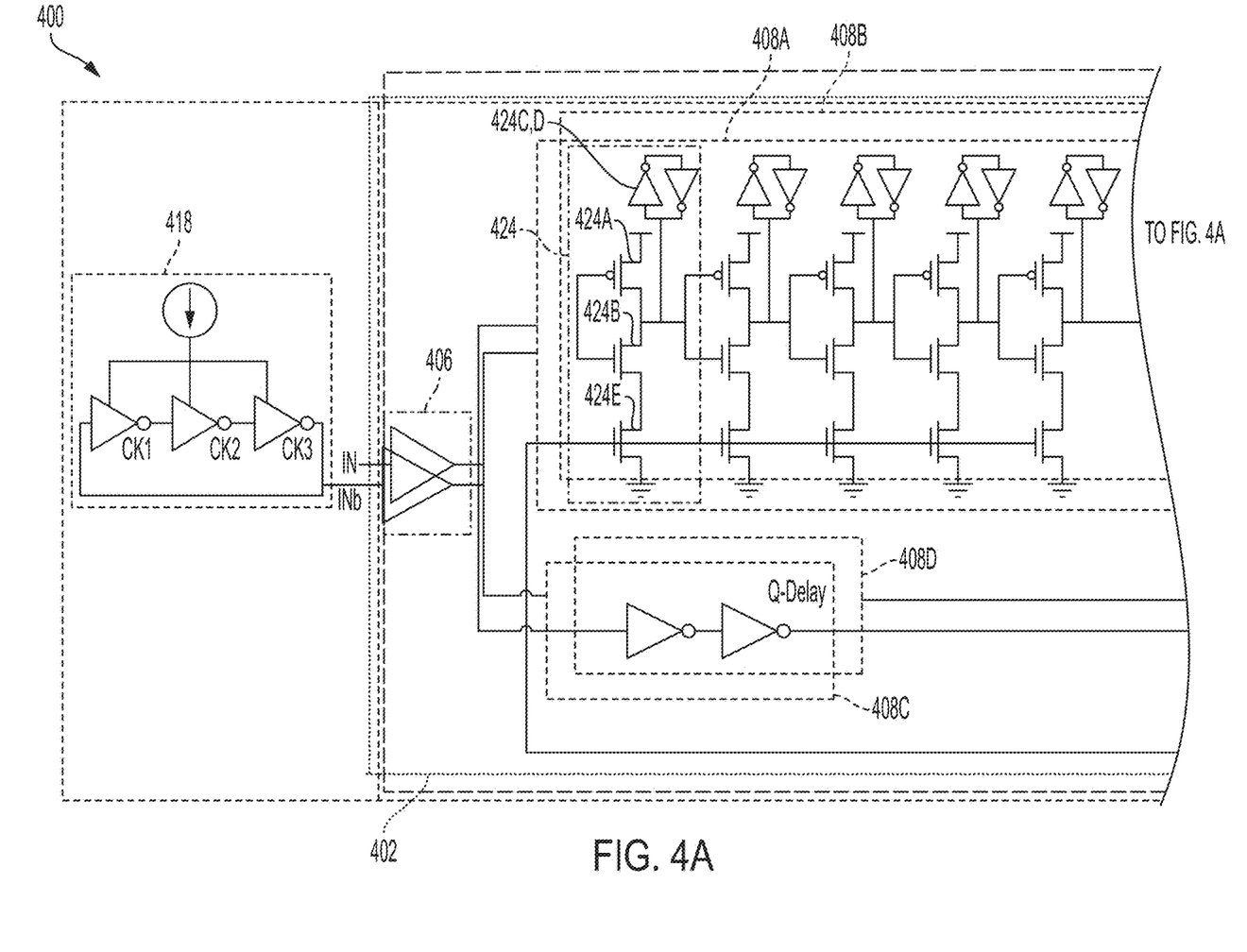
FIGS. 4A, B are a schematic diagram of an IQ generator receiving as inputs multiple phase outputs of a TTG and outputting to a mixer, according to some embodiments.
Figure 4B:
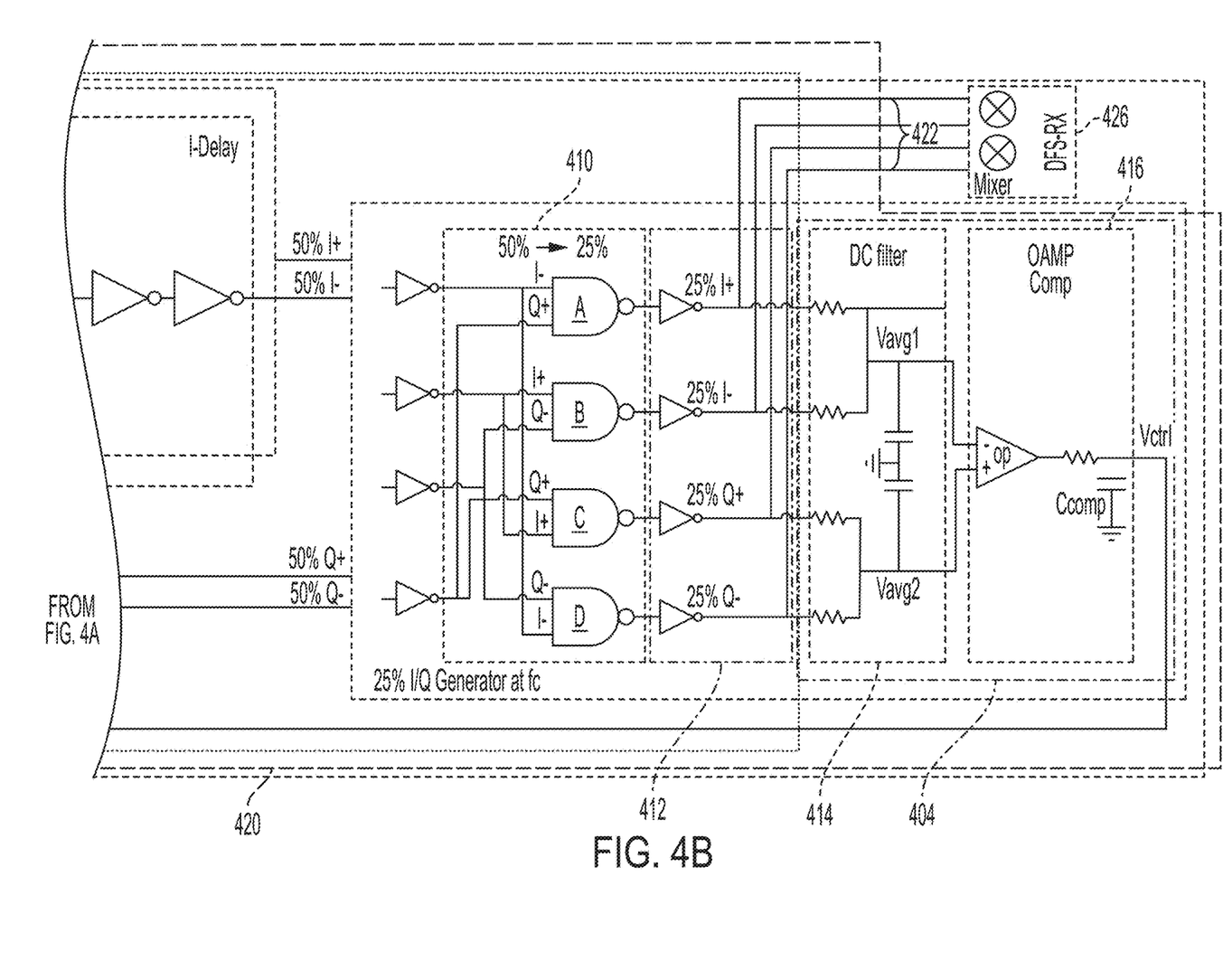
Figure 5:
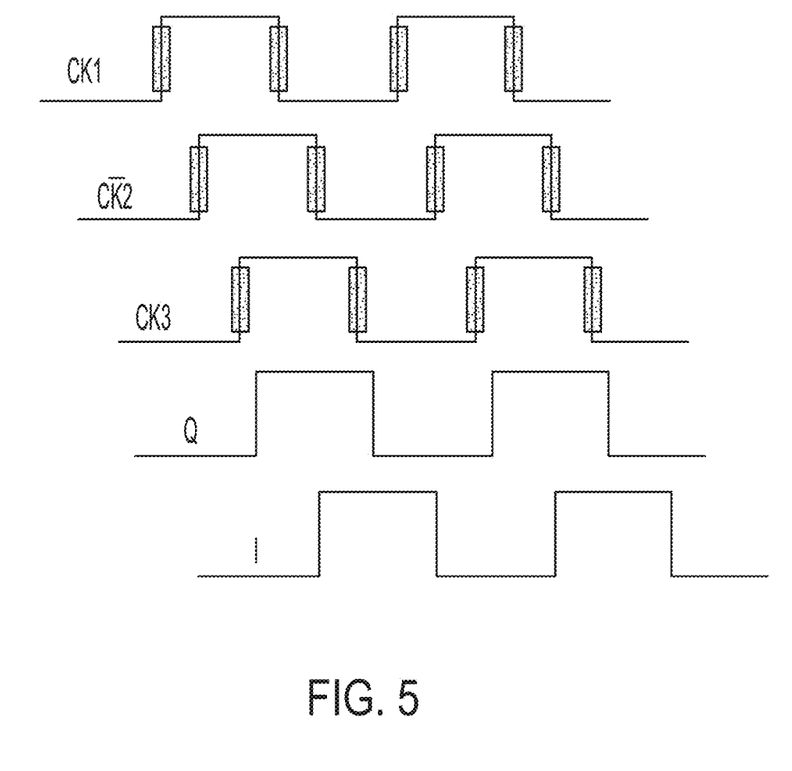
FIG. 5 is a time diagram of the TTG and the IQ generator of FIGS. 4A, B, according to some embodiments.
Figure 6:
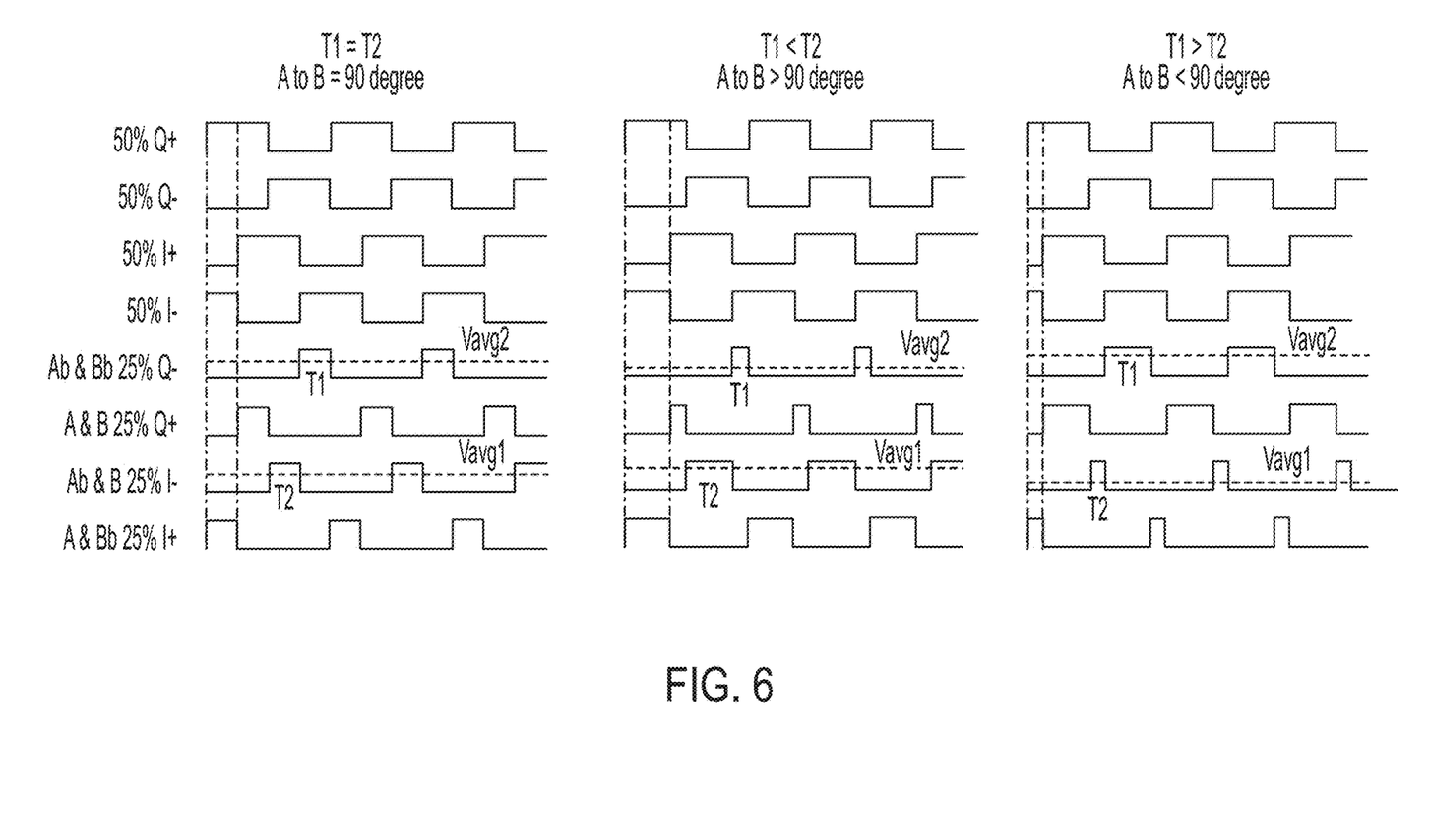
FIG. 6 is a time diagram of the TTG and the IQ generator of FIGS. 4A, B, according to some embodiments.

In some embodiments, an IQ generator may receive as inputs differential outputs of a single phase of a TTG. FIGS. 4A, B depict a portion 400 of a DFS receiver, which may include an IQ generator 420 configured to receive as inputs differential outputs (e.g., IN, INb) of a single phase of a TTG 418 and provide IQ signals 422 to a mixer 426. FIG. 5 and FIG. 6 depict time diagrams of the TTG 418 and the IQ generator 420, according to some embodiments.

The TTG 418 may produce multiple phase signals of a carrier frequency such as CK1, CK2, and CK3. In some embodiments, the TTG 418 may have a differential configuration, and each phase signal may include a pair of differential signals (e.g., IN, INb for CK3). Although some of the multiple phase signals such as CK1 and CK3 may have a phase difference close to 90 degrees, these signals are likely to have large phase error, for example, illustrated as the shaded edges of CK1, CK2, and CK3 in FIG. 5, and thus cannot provide a sufficient signal-to-noise ratio.

The IQ generator 420 may be configured to generate IQ signals with low phase error, for example, illustrated as the sharp edges of I and Q in FIG. 5. The IQ generator 420 may include a delay path 402 and a calibration circuitry 404. The delay path 402 may include a pair of delay buffers 406, configured to receive one of the pair of differential signals IN, INb, respectively. The delay path 402 may include a pair of I-delay circuitries 408A and 408B, configured to receive one of the outputs of the pair of delay buffers 406, respectively, and provide a pair of differential I signals (e.g., 50% I+, 50% I−, which may refer to a pair of differential I signals that has a duty cycle of 50%). The delay path 402 may include a pair of Q-delay circuitries 408C and 408D, configured to receive one of the outputs of the pair of delay buffers 406, respectively, and provide a pair of differential Q signals (e.g., 50% Q+, 50% Q−).

One pair of the pair of I-delay circuitries 408A. 408B and the pair of Q-delay circuitries 408C. 408D may receive a control signal Vctrl, which may be configured to adjust the transconductance of the pair such that the IQ signals 422 are orthogonal in phase. In the illustrated example, each of the pair of I-delay circuitries 408A and 408B includes delay cells 424. A delay cell 424 may include a pair of transistors 424A. 424B sharing a same gate voltage, which may be an output of the pair of delay buffers 406 or an output of another delay cell. The delay cell 424 may include a pair of back-to-back connected inverters 424C, 424D coupled to an output of the pair of transistors 424A, 424B for phase matching. The delay cell 424 may include a delay unit 424E, which may be controlled by the control signal Vcrtl. Although the illustrated delay unit 424E has one transistor, a delay unit may include one or more transistors. Although five delay cells are illustrated, it should be appreciated either I or Q delay circuitry may include any suitable number of delay cells, for example, at least two delay cells. The number of delay cells may be selected depending on, for example, the carrier frequency. The higher the carrier frequency, the smaller the number of delay cells may be needed.

The delay path 402 may include a duty-cycle adjustment circuitry 410 configured to receive the pairs of differential I signals (e.g., 50% I+, 50% I−) and different Q signals (e.g., 50% Q+, 50% Q−), modify the duty cycles of the pairs of differential I signals and different Q signals, and provide a new pair of differential I signals (e.g., 25% I+, 25% I−) and a new pair of differential Q signals (e.g., 25% Q+, 25% Q−). The duty-cycle adjustment circuitry 410 may include four NAND gates A-D configured to provide the new pair of differential I signals (e.g., 25% I+, 25% I−) and the new pair of differential Q signals (e.g., 25% Q+, 25% Q−). In the illustrated example, the NAND gate A provides 25% I+ based on 50% I− and 50% Q+; the NAND gate B provides 25% I− based on 50% I+ and 50% Q−; the NAND gate C provides 25% Q+ based on 50% I+ and 50% Q+; the NAND gate D provides 25% Q− based on 50% I− and 50% Q−.

The calibration circuitry 404 may be configured to generate the control signal Vcrtl that is fed back to the delay path 402. The calibration circuitry 404 may include a DC filter 414 and a low power comparator operational amplifier 416. The DC filter 414 may be configured to generate the average pulse width Vavg1 and the average pulse width Vavg2 of the new pair of I signals (e.g., 25% I+, 25% I−) and the new pair of differential Q signals (e.g., 25% Q+, 25% Q−), respectively. The low power comparator operational amplifier 416 may be configured to generate a control signal Vctrl based on the average pulse widths Vavg1 and Vavg2. The calibration circuitry 404 may modify the value of the control signal Vctrl until the average pulse widths Vavg1 and Vavg2 equal to each other. The equalization of the average pulse widths Vavg1 and Vavg2 enables that the IQ signals are orthogonal in phase as illustrated in FIG. 6 when T1=T2, compared with T1<T2 or T1>T2.

Figure 7:
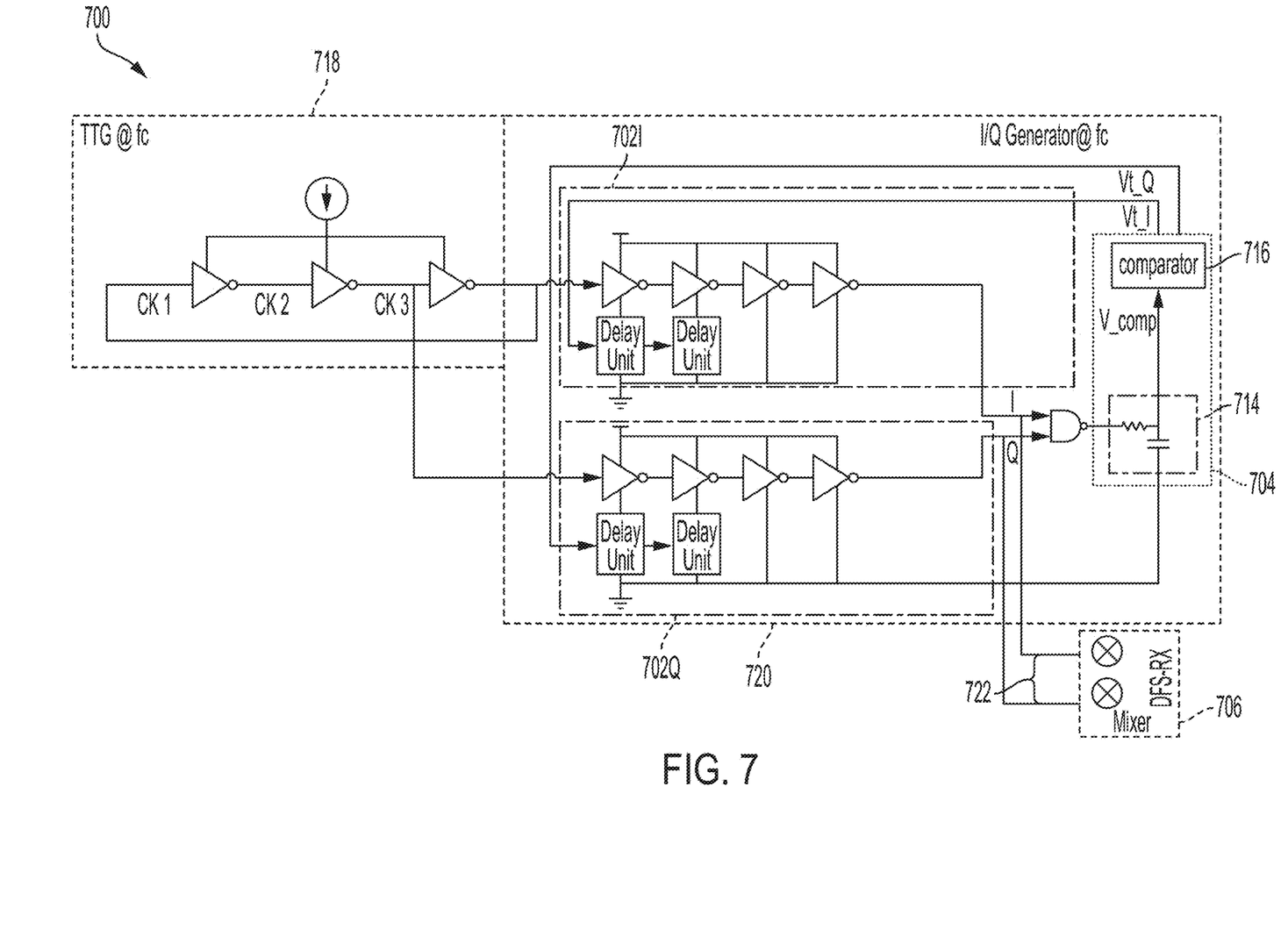
FIG. 7 is a schematic diagram of an IQ generator receiving as inputs differential outputs of a single phase of a TTG and outputting to a mixer, according to some embodiments.
Figure 8:
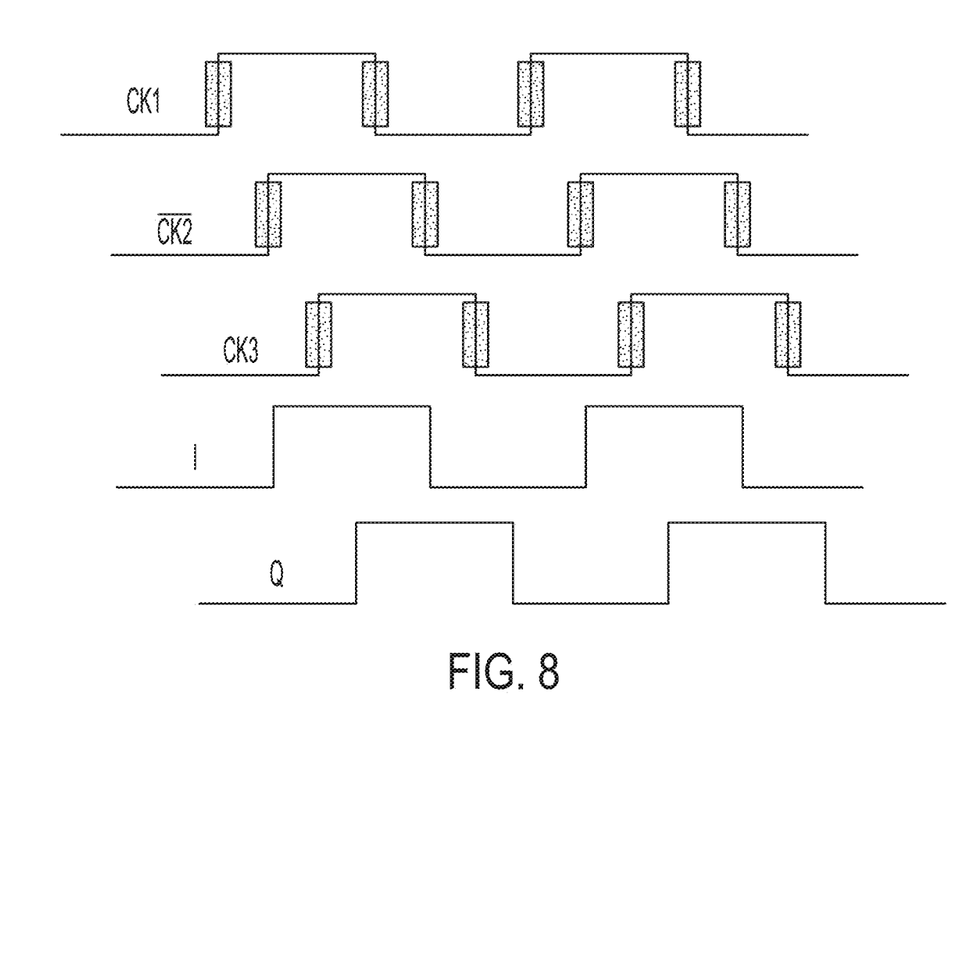
FIG. 8 is a time diagram of the TTG and the IQ generator of FIG. 7, according to some embodiments.

In some embodiments, an IQ generator may receive as inputs multiple phase outputs of a TTG. FIG. 7 depicts a portion 700 of a DFS receiver, which may include an IQ generator 720 configured to receive as inputs multiple phase outputs of a TTG 718 (e.g., CK1, CK3) and provide IQ signals 722 to a mixer 706. FIG. 8 depict a time diagram of the IQ generator of FIG. 7.

The IQ generator 720 may include delay paths 702I, 702Q for respective phase outputs of the TTG 718. The delay paths 702I, 702Q may be configured to convert the multiple phase outputs of the TTG 718 into orthogonal signals (e.g., I, Q). In some embodiments, the delay paths 702I, 702Q may be configured similar to the delay path 402 in FIGS. 4A, B. In some embodiments, the delay paths of an IQ generator having multiple delay paths may include fewer delay cells than the delay path of an IQ generator having a single delay path.

The IQ generator 720 may include a calibration circuitry 704, which may include a DC filter 714 and a comparator 716. The DC filter 714 may be configured to average pulse widths of the IQ signals, and/or generate a voltage V_comp representing a difference between the average pulse widths of the IQ signals. The comparator 716 may be configured to provide control signals Vt_I and Vt_Q to the delay paths 702I, 702Q, respectively, based on the output of the DC filter 714. As the calibration circuitry 404, the calibration circuitry 704 may modify the values of the control signals Vt_I and Vt_Q until the IQ signals have equal average pulse widths.

Various changes may be made to the illustrative structures shown and described herein. For example, IQ generators was described in connection with WiFi technology. IQ generators may be used in connection with any suitable technology. As a specific example of a possible variation. IQ generators may be used in connection with cellular technology.

Various aspects of the apparatus and techniques described herein may be used alone, in combination, or in a variety of arrangements not specially discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

The terms "approximately", "substantially," and "about" may be used to mean within ±20% of a target value in some embodiments, within ±10% of a target value in some embodiments, within +5% of a target value in some embodiments, and yet within +2% of a target value in some embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A signal generator for generating signals that are orthogonal in phase, comprising:
    a delay path configured to generate the signals from an input signal of a carrier frequency; and
    a calibration circuitry configured to provide a control signal to the delay path based at least in part on the signals, wherein
    an operating frequency of the signal generator is less than twice the carrier frequency.

2. The signal generator of claim 1, wherein
    the input signal of the carrier frequency is from a test tone generator.

3. The signal generator of claim 2, wherein
    the input signal of the carrier frequency comprises output signals of the test tone generator that are in two different phases.

4. The signal generator of claim 2, wherein
    the input signal of the carrier frequency comprises output signals of the test tone generator that are in a single phase.

5. The signal generator of claim 4, wherein
    the output signals of the test tone generator comprise a pair of differential signals in the single phase.

6. The signal generator of claim 1, wherein
    the delay path comprises one or more delay cells configured to adjust their transconductances based at least in part on the control signal from the calibration circuitry.

7. The signal generator of claim 6, wherein
    a delay cell of the one or more delay cells comprises
        a pair of transistors that receive the input signal of the carrier frequency,
        a back-to-back inverter coupled to the pair of transistors, and
        a delay unit connected in series with the pair of transistors and configured to adjust its transconductance based at least in part on the control signal from the calibration circuitry.

8. The signal generator of claim 1, wherein
    the calibration circuitry comprises a comparator configured to compare average pulse widths of the signals and provide the control signal based at least in part on the comparison.

9. A signal generator for generating signals that are orthogonal in phase, comprising:
    one or more delay paths comprising input nodes that receive an input signal of a carrier frequency and output nodes that provide the signals; and
    a calibration circuitry comprising input nodes that receive the signals and an output node that provides a control signal to the one or more delay paths, wherein
    an operating frequency of the signal generator is less than twice the carrier frequency.

10. The signal generator of claim 9, wherein
    the input signal of the carrier frequency is from a test tone generator.

11. The signal generator of claim 10, wherein
    the input signal of the carrier frequency comprises a pair of differential signals in a single phase.

12. The signal generator of claim 11, wherein
    the one or more delay paths comprise a single delay path, and the output node of the calibration circuitry provides a control signal to the single delay path.

13. The signal generator of claim 12, wherein
the single delay path comprises a plurality of delay cells controlled by the control signal.

14. The signal generator of claim 12, wherein
the input signal of the carrier frequency has a 50% duty cycle, and
the single delay path comprises a circuitry that receives signals with the 50% duty cycle and provides signals with a 25% duty cycle.

15. The signal generator of claim 10, wherein
the input signal of the carrier frequency comprises a first output signal of the test tone generator that is in a first phase and a second output signal of the test tone generator that is in a second phase different from the first phase.

16. The signal generator of claim 15, wherein
the one or more delay paths comprise a first delay path for the first output signal of the test tone generator and a second delay path for the second output signal of the test tone generator.

17. The signal generator of claim 16, wherein
the output node of the calibration circuitry is a first output node of the calibration circuitry,
the control signal is a first control signal,
the first control signal is provided to the first delay path, and
the calibration circuitry comprises a second output node that provides a second control signal to the second delay path.

18. The signal generator of claim 9, wherein
the calibration circuitry comprises a direct current (DC) filter comprising the input nodes of the calibration circuitry.

* * * * *